United States Patent
Tsuchiya et al.

[11] Patent Number: 5,882,844
[45] Date of Patent: Mar. 16, 1999

[54] CHEMICALLY AMPLIFIED POSITIVE RESIST COMPOSITION

[75] Inventors: Junji Tsuchiya; Toshinobu Ishihara; Shigehiro Nagura; Katsuya Takemura, all of Niigata-ken; Tsuguo Yamaoka, Funabashi, all of Japan

[73] Assignee: Shin-Etsu Chemical Co., Ltd., Japan

[21] Appl. No.: 831,301

[22] Filed: Apr. 1, 1997

[30] Foreign Application Priority Data

Apr. 2, 1996 [JP] Japan ..................................... 8-104589

[51] Int. Cl.$^6$ .......................... G03F 7/029; G03F 7/032
[52] U.S. Cl. .................... 430/288.1; 430/286.1; 430/287.1; 430/270.1; 522/31; 522/25; 522/91; 522/142; 522/148
[58] Field of Search ............... 430/288.1, 286.1, 430/287.1, 270.1; 522/31, 25, 91, 142, 148

[56] References Cited

U.S. PATENT DOCUMENTS

| | | | |
|---|---|---|---|
| 4,978,604 | 12/1990 | Banks et al. | 430/286.1 |
| 5,069,997 | 12/1991 | Schwalm et al. | 430/270.1 |
| 5,286,600 | 2/1994 | Ochiai et al. | 430/270.1 |
| 5,364,738 | 11/1994 | Kondo et al. | 430/288.1 X |
| 5,609,989 | 3/1997 | Bantu et al. | 430/270.1 |
| 5,612,170 | 3/1997 | Takemura et al. | 430/270.1 |
| 5,712,078 | 1/1998 | Huang et al. | 430/270.1 |

FOREIGN PATENT DOCUMENTS

| | | |
|---|---|---|
| 63-149640 | 6/1988 | Japan . |
| 5-127369 | 5/1993 | Japan . |
| 5-232706 | 9/1993 | Japan . |
| 5-249662 | 9/1993 | Japan . |
| 5-249683 | 9/1993 | Japan . |
| 5-257283 | 10/1993 | Japan . |
| 5-289340 | 11/1993 | Japan . |
| 6-230574 | 8/1994 | Japan . |
| 6-242605 | 9/1994 | Japan . |
| 6-266110 | 9/1994 | Japan . |
| 6-266111 | 9/1994 | Japan . |
| 7-92678 | 4/1995 | Japan . |
| 7-92680 | 4/1995 | Japan . |
| 7-92681 | 4/1995 | Japan . |
| 7-118651 | 5/1995 | Japan . |
| 7-120929 | 5/1995 | Japan . |
| 7-128859 | 5/1995 | Japan . |
| 7-134419 | 5/1995 | Japan . |
| 7-209868 | 8/1995 | Japan . |

OTHER PUBLICATIONS

Takemura et al, 127: 18192, Chemical Abstracts, American Chemical Society, 1998, English Abstract of Jpn. k okai Tokkyo Koho, JP 0908 7391 A2 dated Mar. 31, 1997, 22 pages.
English abstract of JP–A 265213/93.

*Primary Examiner*—Cynthia Hamilton
*Attorney, Agent, or Firm*—Millen, White, Zelano, & Branigan, P.C.

[57] ABSTRACT

A chemically amplified positive resist composition contains (A) an organic solvent, (B) a base resin in the form of a polysiloxane having phenolic hydroxyl groups some of which are protected with alkoxyalkyl groups and having a weight average molecular weight of 2,000–50,000, (C) a photoacid generator, and (D) a vinyl ether group-containing compound. The composition has high sensitivity to actinic radiation, is developable with aqueous base to form a resist pattern, and lends itself to fine patterning.

17 Claims, No Drawings

CHEMICALLY AMPLIFIED POSITIVE RESIST COMPOSITION

BACKGROUND OF THE INVENTION

1. Field of the Invention

This invention relates to a chemically amplified positive resist composition which is highly sensitive to actinic radiation such as deep-UV, electron beam and X-ray, can be developed with alkaline aqueous solution to form a pattern, and is thus suitable for use in a fine patterning technique.

2. Prior Art

As the LSI technology tends toward higher integration and higher speed, further refinement of pattern rules is required. The current patterning technology mostly relies on light exposure which is now approaching the essential limit of resolution which is dictated by the wavelength of a light source. It is generally recognized that in light exposure using g-line (wavelength 436 nm) or i-line (wavelength 365 nm) as a light source, a pattern rule of about 0.5 $\mu$m is the limit. For LSIs fabricated by such light exposure technique, a degree of integration equivalent to 16 mega-bit DRAM is the limit. At present, LSIs fabricated in the laboratory have reached this stage. It is urgently required to develop a finer patterning technique.

Since Ito et al. proposed a chemically amplified positive resist composition comprising a polyhydroxystyrene resin whose hydroxyl group is protected with a tert-butoxycarbonyloxy group (t-Boc group), known as PBOCST, and a photoacid generator in the form of an onium salt, a number of high sensitivity, high resolution resist compositions have been developed. Although these chemically amplified positive resist compositions have high sensitivity and high resolution, formation of a fine pattern having a high aspect ratio is deemed difficult when the mechanical strength of the resultant pattern is taken into account.

A number of chemically amplified positive resist compositions using polyhydroxystyrene as a base resin and having sensitivity to deep-UV, electron beam and X-ray are known in the art. These resist compositions rely on a single layer resist technique although a two-layer resist technique is advantageous in forming high aspect ratio patterns on stepped substrates. Because of such outstanding problems of substrate steps, light reflection from substrates, and difficult formation of high aspect ratio patterns, the known resist compositions are far from practical.

It is known that the two-layer resist technique is advantageous in forming high aspect ratio patterns on stepped substrates. To enable alkali development in the two-layer resist technique, silicone polymers having hydrophilic groups such as hydroxyl and carboxyl groups are required. Since the silicones having a hydroxyl group directly attached thereto, however, undergo crosslinking reaction in the presence of acid, it is difficult to apply such silanols to chemically amplified positive resist materials.

While polyhydroxybenzylsilsesquioxane is known as a stable alkali soluble silicone polymer, its derivatives obtained by protecting some hydroxyl groups with t-Boc groups form chemically amplified silicone system positive resist materials when combined with photoacid generators as disclosed in Japanese Patent Application Kokai (JP-A) No. 118651/1995 and SPIE, Vol. 1952 (1993), 377. However, polyhydroxybenzylsilsesquioxanes used therein have a somewhat low molecular weight and a low softening temperature and therefore, resist materials using them have the problem that their pattern can be collapsed by heat encountered upon etching.

SUMMARY OF THE INVENTION

Therefore, an object of the present invention is to provide a chemically amplified positive resist composition which has high sensitivity and resolution, is advantageously applicable to the two-layer resist technique suitable for forming high aspect ratio patterns, and can form a heat resistant pattern.

We have found that a chemically amplified positive resist composition comprising an organic solvent, a base resin in the form of a polymer of formula (1) to be described later, having a weight average molecular weight of 2,000 to 50,000, a photoacid generator, and a compound having at least two vinyl ether groups in a molecule has high sensitivity and resolution, can form a heat resistant pattern, and is very advantageously used as the two-layer resist material.

As mentioned previously, one exemplary base resin of a positive resist material suitable for the two-layer resist technique is a polysiloxane whose skeleton is alkali soluble and having an alkali soluble functional group protected with an acid labile group. One exemplary alkali soluble polysiloxane in stable supply is poly(p-hydroxybenzylsilsesquioxane) comprising units of formula (3) to be described later. Useful acid labile groups for protecting some of phenolic hydroxyl groups are groups of formulae (2) and (4) to be described later, tert-butyl groups, and trialkylsilyl groups. Among these, alkoxyalkyl groups of formula (2) are protective groups which can be easily eliminated because the activation energy required for elimination is very low.

We have further found that the use as a base resin of a polysiloxane of formula (1) having phenolic hydroxyl groups some of which are protected with such alkoxyalkyl groups enables to select a weak acid as the acid to be used for elimination, especially even an acid which is unlikely to diffuse or evaporate or is resistant to deactivation by contamination. Furthermore, by effecting crosslinking reaction between the polysiloxane and the vinyl ether group-containing compound, the molecular weight of a polymer in a resist film can be increased to thereby improve the heat resistance of the resist pattern. Since the crosslinks thus newly formed are readily decomposable by an acid catalyst generated upon exposure, the difference in dissolution rate in basic developer between unexposed and exposed areas becomes greater enough to form a pattern with a high resolution. The present invention is predicated on these findings.

Formulae (1), (3) and (4) are shown below.

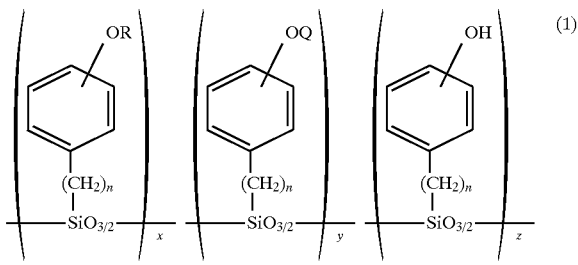

In formula (1), R is a group of formula (2):

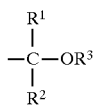
(2)

wherein $R^1$ and $R^2$ are independently a hydrogen atom or a normal or branched alkyl group having 1 to 6 carbon atoms, $R^3$ is a normal, branched or cyclic alkyl group having 1 to 10 carbon atoms, or $R^1$ and $R^3$, taken together, may form a ring; Q is an acid labile group; letters x, y and z are numbers satisfying $0.05 \leq x/(x+y+z) \leq 0.8$, $0 \leq y/(x+y+z) \leq 0.5$, and $0.2 \leq z/(x+y+z) \leq 0.95$, $x+y+z=1$, and n is an integer of 1 to 3.

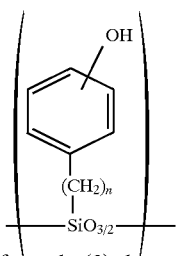
(3)

In formula (3), letter n is an integer of 1 to 3.

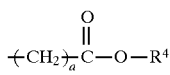
(4)

In formula (4), $R^4$ is a normal or branched alkyl group having 1 to 6 carbon atoms and letter a is equal to 0 or 1.

Accordingly, in a first aspect, the present invention provides a chemically amplified positive resist composition comprising (A) an organic solvent,
(B) a base resin in the form of a polymer of formula (1) having a weight average molecular weight of 2,000 to 50,000,
(C) a photoacid generator, and
(D) a compound having at least two vinyl ether groups in a molecule.

In a second aspect, the present invention provides a chemically amplified positive resist composition comprising (A) an organic solvent,
(B) a base resin in the form of a polymer of formula (1),
(C) a photoacid generator,
(D) a compound having at least two vinyl ether groups in a molecule, and
(E) a dissolution rate regulator in the form of a compound having a molecular weight of 100 to 1,000 and at least two phenolic hydroxyl groups in a molecule, the hydrogen atom of the phenolic hydroxyl group being replaced by an acid labile group in an average proportion of 10 to 100% of the entire phenolic hydroxyl groups.

In a third aspect, the present invention provides a chemically amplified positive resist composition comprising (A) an organic solvent,
(B) a base resin in the form of a polymer of formula (1),
(C) a photoacid generator,
(D) a compound having at least two vinyl ether groups in a molecule,
(E) a dissolution rate regulator in the form of a compound having a molecular weight of 100 to 1,000 and at least two phenolic hydroxyl groups in a molecule, the hydrogen atom of the phenolic hydroxyl group being replaced by an acid labile group in an average proportion of 10 to 100% of the entire phenolic hydroxyl groups, and
(F) another dissolution rate regulator in the form of a compound having a molecular weight of more than 1,000 to 3,000 and a phenolic hydroxyl group in a molecule, the hydrogen atom of the phenolic hydroxyl group being partially replaced by an acid labile group in an average proportion of more than 0% to 60% of the entire phenolic hydroxyl groups.

In all the embodiments, the chemically amplified positive resist compositions may further contain (G) an additive in the form of a basic compound. The photoacid generator (C) is typically an onium salt.

DETAILED DESCRIPTION OF THE INVENTION

Briefly stated, the chemically amplified positive resist composition of the present invention is based on a resist composition essentially comprising (A) an organic solvent, (B) a base resin, and (C) a photoacid generator. And (D) a compound having at least two vinyl ether groups in a molecule is blended therein.

Any desired organic solvent may be used as component (A) insofar as components (B) to (D) are soluble therein. Preferred are those solvents in which the respective components are soluble and which help a resist film extend uniformly. Examples of the organic solvent include benzene series aromatic hydrocarbons such as xylene; ketones such as acetone; ethers such as ethylene glycol monomethyl ether, diethylene glycol monomethyl ether, ethylene glycol monoethyl ether, ethylene glycol dibutyl ether, and diethylene glycol dimethyl ether; and esters such as butyl acetate, cellosolve acetate, ethyl lactate, methyl lactate, propyl lactate, and butyl lactate, alone or in admixture of two or more. The preferred solvents are propylene glycol monomethyl ether acetate and ethyl lactate because the base resin of the resist composition is most soluble therein.

The amount of the organic solvent used is generally about 200 to 1,000%, preferably about 400 to 800% by weight based on the weight of the base resin. Compositions with less amounts of the solvent would somewhat lack film formability. Compositions with more amounts of the solvent would form too thin films which are unacceptable in practice.

The base resin (B) is a copolymer having recurring units as shown by the following general formula (1).

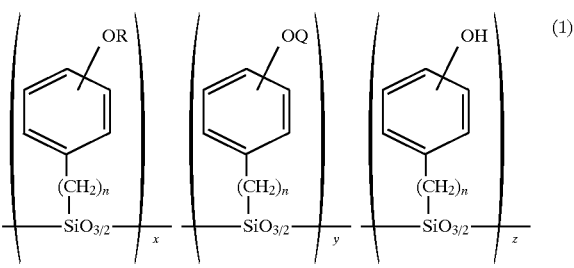
(1)

In formula (1), R is an alkoxyalkyl group of the following general formula (2).

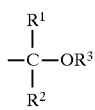

In formula (2), $R^1$ and $R^2$ are independently a hydrogen atom or a normal or branched alkyl group having 1 to 6 carbon atoms, especially 1 to 3 carbon atoms, $R^3$ is a normal, branched or cyclic alkyl group having 1 to 10 carbon atoms, especially 3 to 6 carbon atoms. Alternatively, $R^2$ and $R^3$, taken together, may form a ring. Examples of the normal and branched alkyl groups include methyl, ethyl, propyl, isopropyl, n-butyl, isobutyl, and tert-butyl. A typical cyclic alkyl group is cyclohexyl.

Examples of the alkoxyalkyl group of formula (2) are shown below by structural formulae.

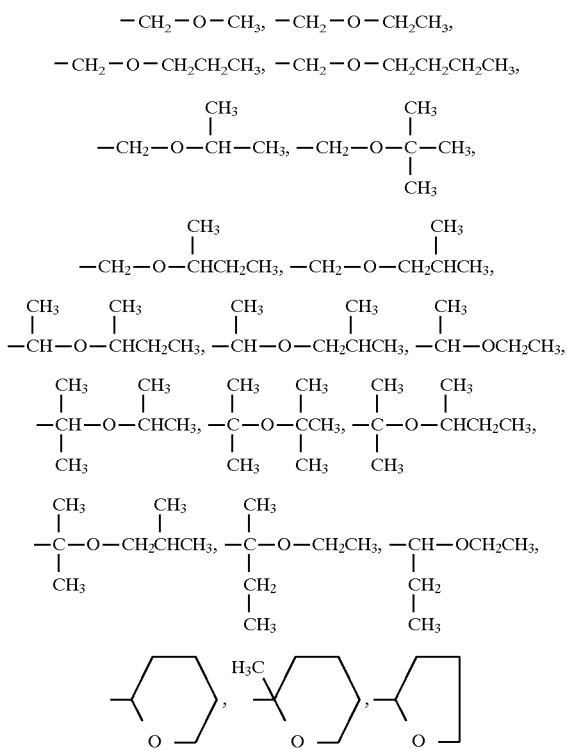

In formula (1), Q is an acid labile group different from R. A choice may be made among numerous acid labile groups. As long as Q is different from R, Q may be either an alkoxyalkyl group of formula (2) or an acid labile group other than alkoxyalkyl groups. The acid labile groups other than alkoxyalkyl groups include groups having a carbonyl group as represented by the following formula (4):

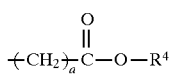         (4)

wherein $R^4$ is a normal or branched alkyl group having 1 to 6 carbon atoms and letter a is equal to 0 or 1, such as a tert-butoxycarbonyl group; tert-butyl group; and trialkylsilyl groups whose alkyl moiety has 1 to 6 carbon atoms, such as trimethylsilyl and tri-tert-butyldimethylsilyl groups.

According to the invention, R in formula (1) is an alkoxyalkyl group such as ethoxyethyl, ethoxypropyl and butoxyethyl groups. If Q is a group having carbonyl such as a tert-butoxycarbonyl group or an acid labile group other than alkoxyalkyl groups such as tetrahydropyranyl, tetrahydrofuranyl, tert-butyl and trialkylsilyl groups, then the resulting resist composition possesses both the ease of elimination of an alkoxyalkyl group represented by R and inhibited alkali dissolution by an acid labile group such as a carbonyl group represented by Q. These two acid labile groups cooperate such that one compensates for the drawback of the other developed when the respective acid labile groups are separately introduced and in such a manner as to derive the advantages as resist material of the respective acid labile groups. Where different types of acid labile groups are introduced in this way, it is preferred to use as a base resin a combination of an alkoxyalkyl group with a group having carbonyl, especially a combination of ethoxyethyl group with tert-butoxycarbonyl group when the characteristics of the resultant resist composition are taken into account.

In formula (1), letters x, y and z are numbers satisfying: $0.05 \leq x/(x+y+z) \leq 0.8$, preferably $0.1 \leq x/(x+y+z) \leq 0.5$, $0 \leq y/(x+y+z) \leq 0.5$, preferably $0 \leq y/(x+y+z) \leq 0.3$, and $0.2 \leq z/(x+y+z) \leq 0.95$, preferably $0.5 \leq z/(x+y+z) \leq 0.9$. $x+y+z=1$. If the polymer of formula (1) does not contain either one of the unit having a phenolic hydroxyl group and the units having a phenolic hydroxyl group protected with an acid labile group, the objects of the invention are not fully achieved. If the proportion of x to the total (x+y+z) is less than 0.05, then it becomes difficult to take advantage of the alkoxyalkyl group. If the proportion of z to the total is more than 0.95, then a resist film experiences substantial thinning and even a resolution decline. If the proportion of x to the total is more than 0.8, if the proportion of y to the total is more than 0.5, or if the proportion of z to the total is less than 0.2, then development with aqueous base becomes impossible. The compositional ratio of acid labile group to hydroxyl group is preferably selected to meet: $0.1 \leq (x+y)/(x+y+z) \leq 0.5$, especially $0.15 \leq (x+y)/(x+y+z) \leq 0.4$. It is noted that n in formula (1) is an integer of 1, 2 or 3.

The base resin has a weight average molecular weight (Mw) of 2,000 to 50,000, preferably 3,000 to 20,000. With Mw <2,000, some resist compositions become poor in film formation and less resistant to oxygen plasma. With Mw>50,000, some resist compositions become insoluble in common solvents.

The above-defined polysiloxane as the base resin can be synthesized according to the method of JP-A 118651/1994.

Photoacid generator (C) of the chemically amplified positive resist composition according to the invention may be selected from well-known photoacid generators which are decomposed, upon exposure to actinic radiation such as deep-UV, electron beam and X-ray, to generate acid. Included are onium salts, oxime sulfonic acid derivatives, hydroxyimidosulfonate derivatives, 2,6-dinitrobenzylsulfonic acid derivatives, pyrogallolsulfonate derivatives, diazonaphthoquinone sulfonate derivatives, 2,4-bistrichloromethyl-6-aryl-1,3,5-triazine derivatives, and α, α'-bisaryl-sulfonyl diazomethane derivatives. Since the base resin tends to have a low glass transition temperature (Tg) due to the presence of an alkoxyalkyl group therein, onium salts featuring efficient acid generation and enhanced dissolution inhibition are preferred in order to avoid such tendency. Preferred in this context are onium salts of the following general formula (5):

         (5)

wherein $R^5$ is independently selected from substituted or unsubstituted aromatic groups, M is sulfonium or iodonium, Y is a substituted or unsubstituted alkyl or sulfonate group, and letter b is equal to 2 or 3.

Illustrative, non-limiting, examples of the onium salt are shown by the following structural formulae.

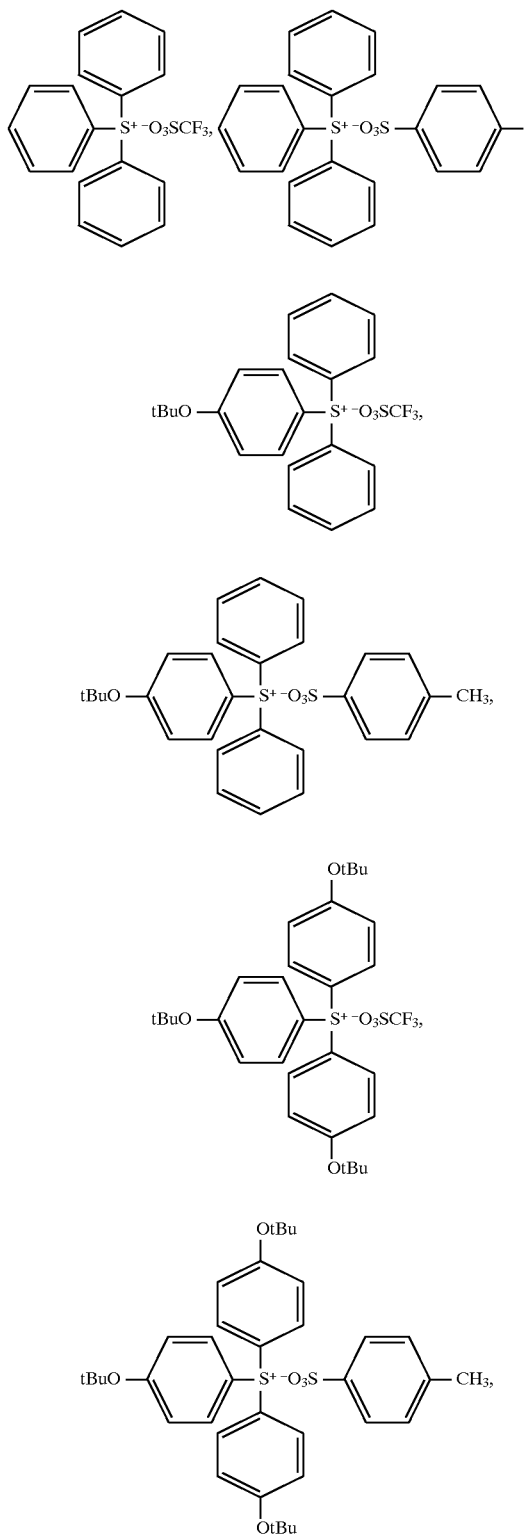

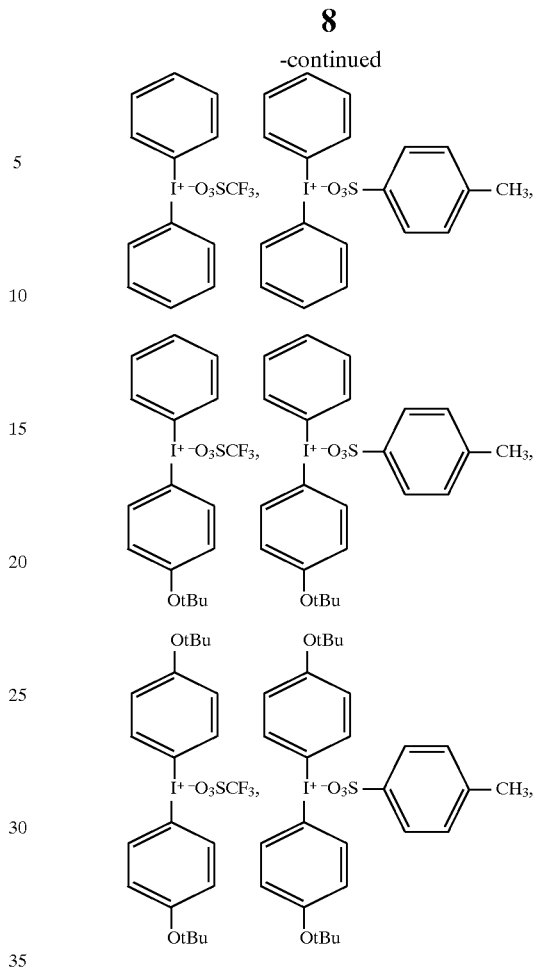

In the formulae, tBu stands for tert-butyl.

Desirably, the photoacid generator is added in an amount of 0.5 to 15%, especially 1 to 10% by weight based on the weight of solids. Resist compositions containing less amounts of the photoacid generator are less sensitive though most resist characteristics are maintained. As the amount of photoacid generator added increases, resist compositions tend to increase sensitivity and hence, contrast. With an excess of the photoacid generator, resist compositions still show most resist characteristics, but a further increase of sensitivity is not expected and oxygen plasma resistance lowers.

The chemically amplified positive resist composition of the invention further contains (D) a compound having at least two vinyl ether groups in a molecule.

The compounds having at least two vinyl ether groups in a molecule include vinyl ether compounds of the following general formulae (I) and (II).

  (I)

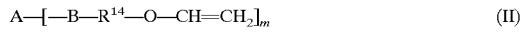  (II)

In the formulae, A is an alkyl, aryl or heterocyclic group having a valence of m, B is —CO—O—, —NHCOO— or —NHCONH—, $R^{14}$ is a normal or branched alkylene group having 1 to 10 carbon atoms, letter n is 0 or an integer of 1 to 10, m is an integer of 2 to 6.

The organic groups represented by A are exemplified below.
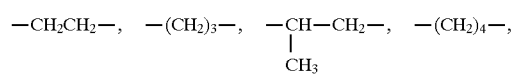
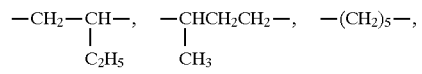
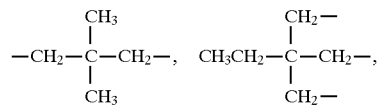
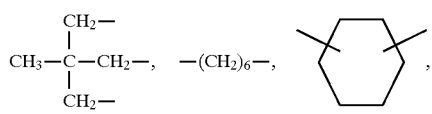
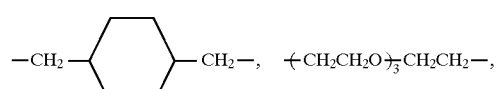
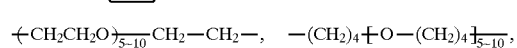
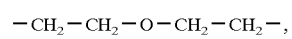
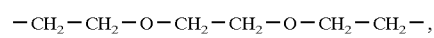
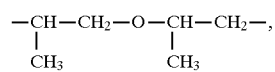
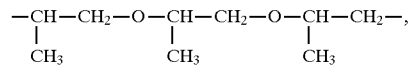
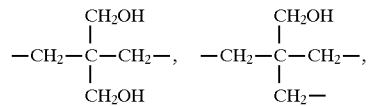
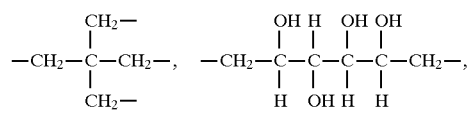
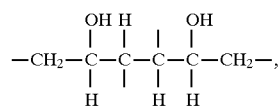
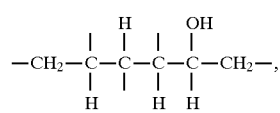
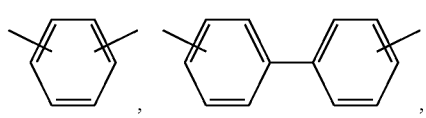
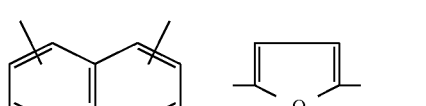
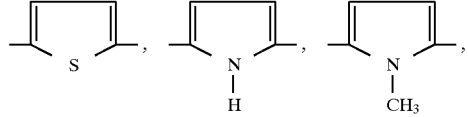
-continued
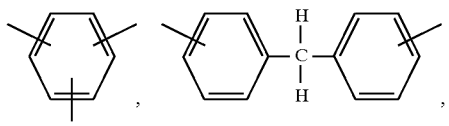
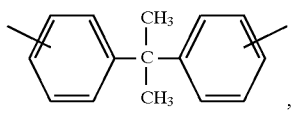
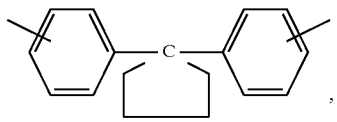
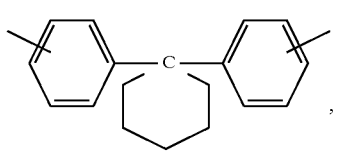
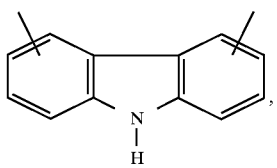
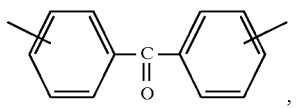
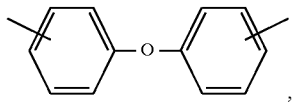
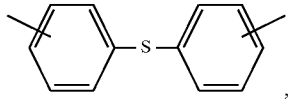
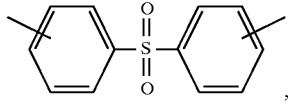
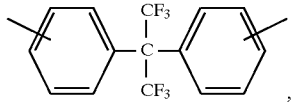
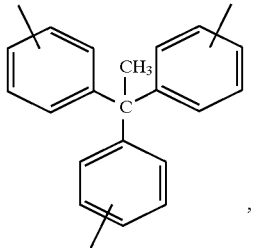

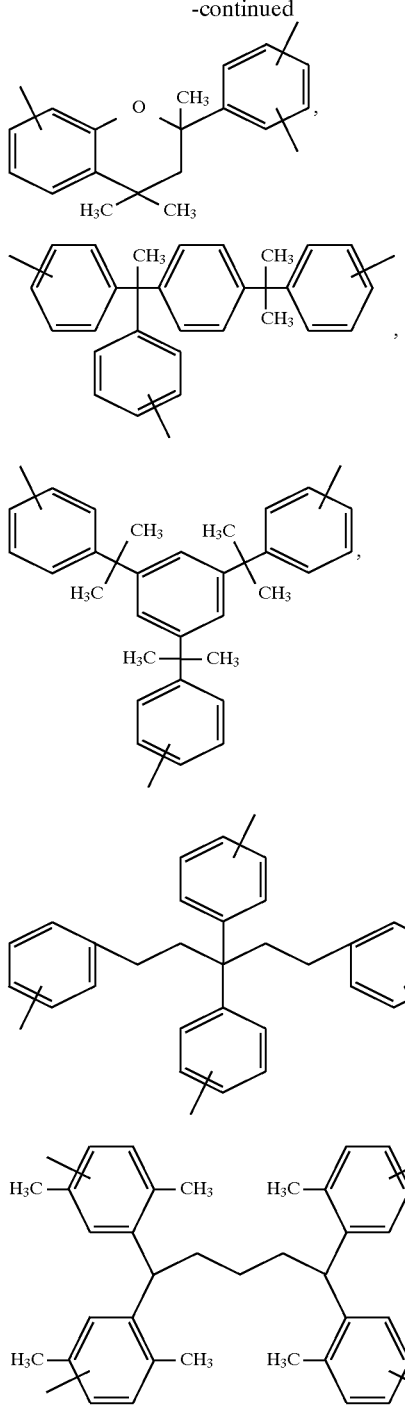

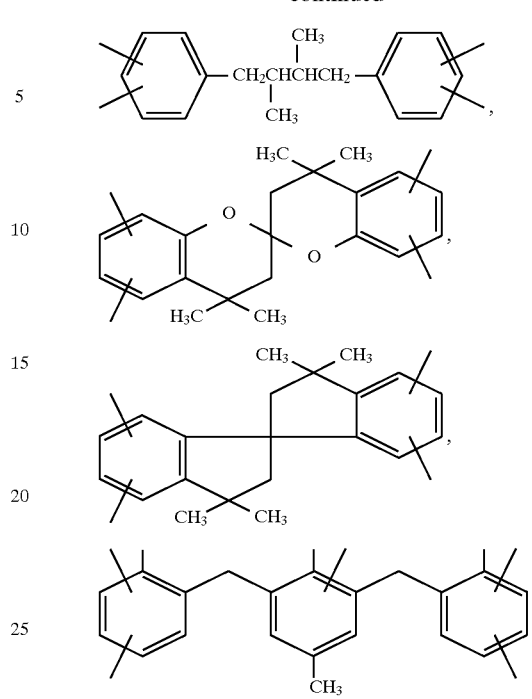

The compounds of formula (I) can be synthesized, for example, by the method described in Stephen C. Lapin, Polymers Paint Colour Journal, 179 (4237), 321 (1988), more specifically by reacting polyhydric alcohols or polyhydric phenols with acetylene or reacting polyhydric alcohols or polyhydric phenols with halogenated alkyl vinyl ethers. Illustrative, non-limiting examples of the compound of formula (I) include ethylene glycol divinyl ether, triethylene glycol divinyl ether, 1,3-butane diol divinyl ether, tetramethylene glycol divinyl ether, neopentyl glycol divinyl ether, trimethylol propane trivinyl ether, trimethylol ethane trivinyl ether, hexane diol divinyl ether, 1,4-cyclohexane diol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylol propane triethylene vinyl ether, trimethylol propane diethylene vinyl ether, pentaerythritol diethylene vinyl ether, pentaerythritol triethylene vinyl ether, pentaerythritol tetraethylene vinyl ether as well as the compounds of the following formulae (I-1) through (I-31).

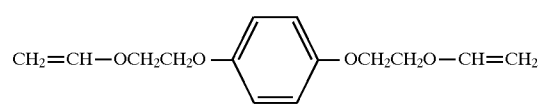
(I-1)

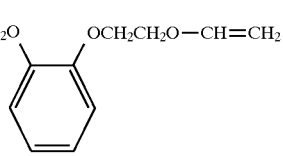
(I-2)

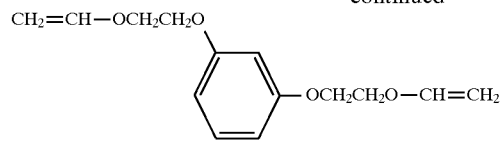 (I-3)
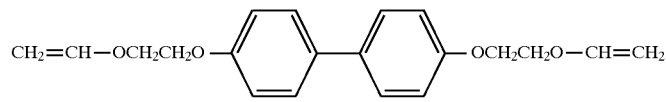 (I-4)
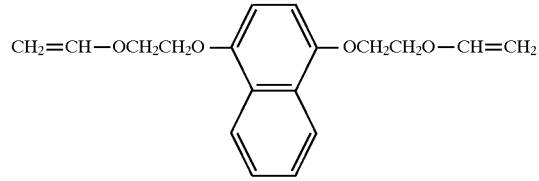 (I-5)
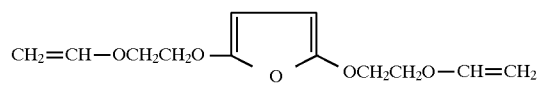 (I-6)
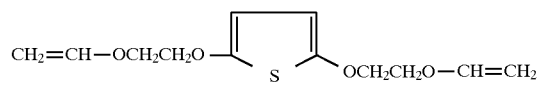 (I-7)
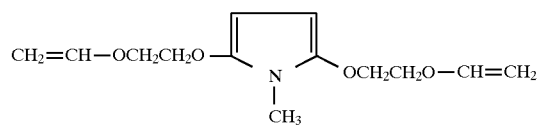 (I-8)
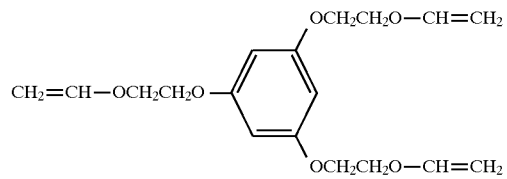 (I-9)
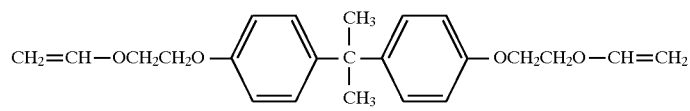 (I-10)
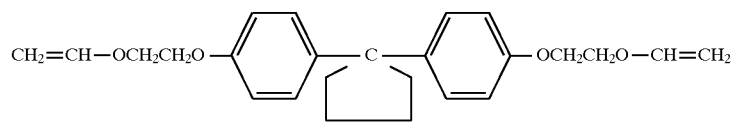 (I-11)
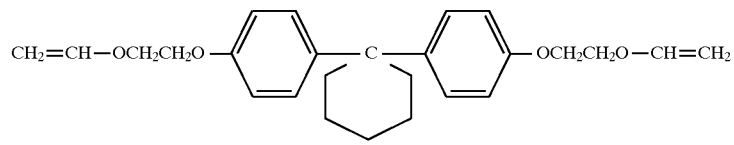 (I-12)
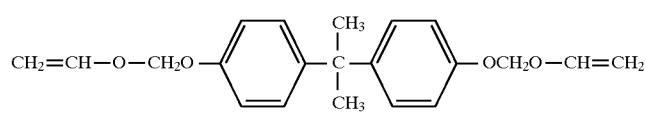 (I-13)
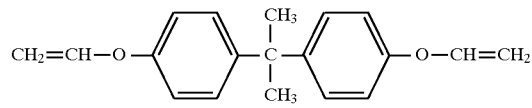 (I-14)

-continued
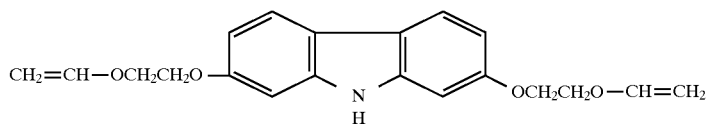
(I-15)
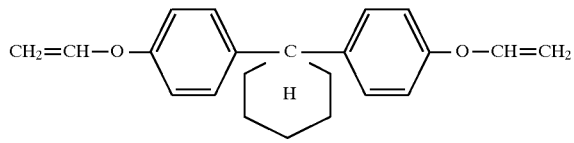
(I-16)
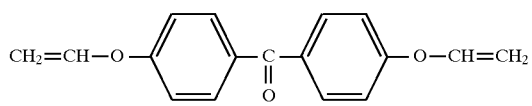
(I-17)
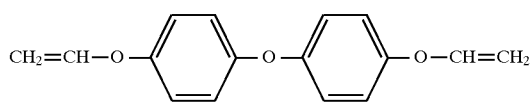
(I-18)
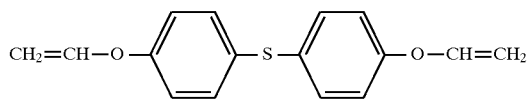
(I-19)
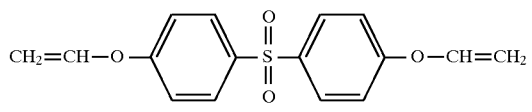
(I-20)
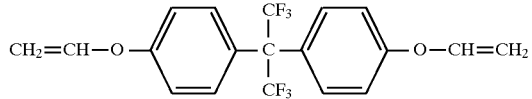
(I-21)
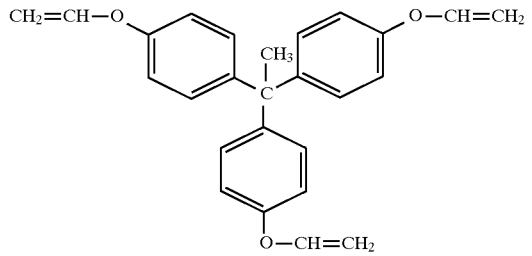
(I-22)
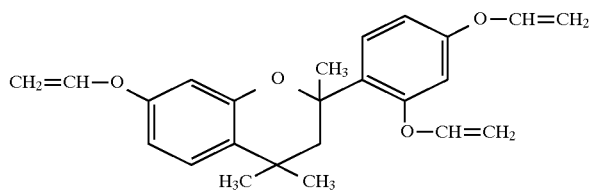
(I-23)
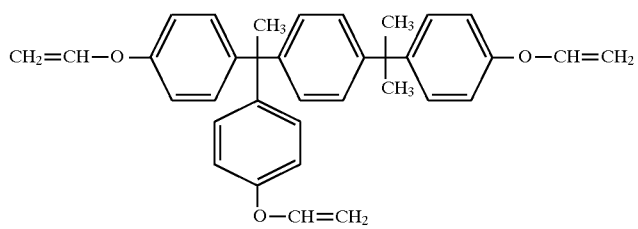
(I-24)

-continued
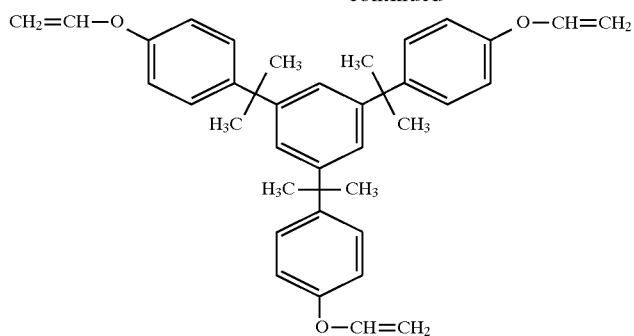 (I-25)
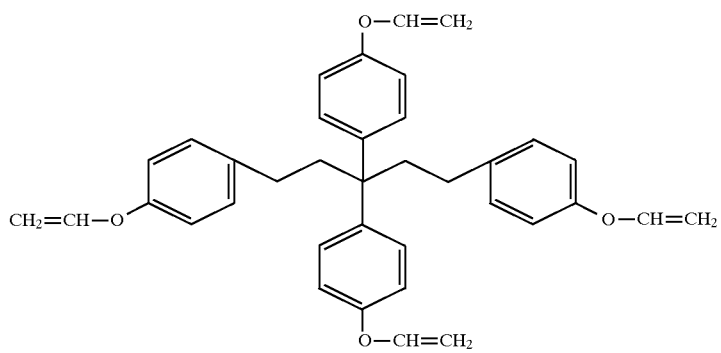 (I-26)
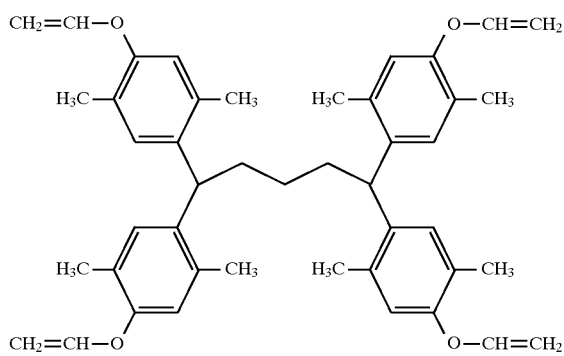 (I-27)
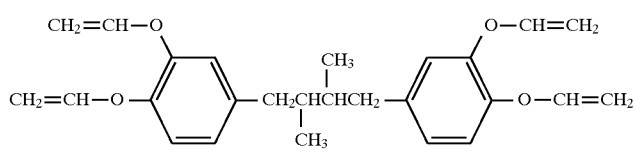 (I-28)
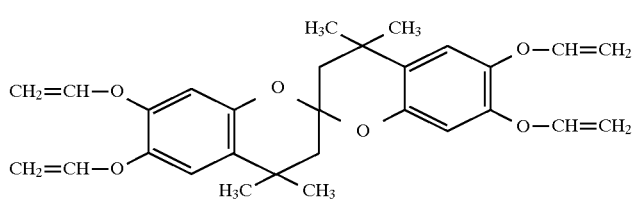 (I-29)
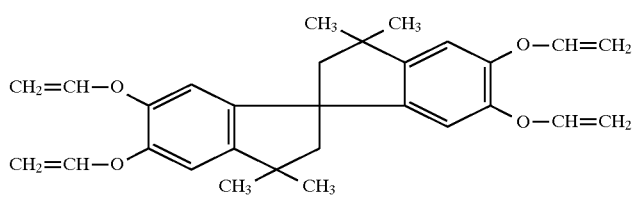 (I-30)

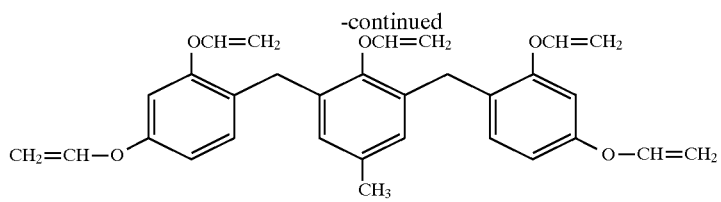
(I-31)

The compounds of formula (II) wherein B is —CO—O— can be synthesized by reacting polyvalent carboxylic acids with halogenated alkyl vinyl ethers. Illustrative, non-limiting examples include terephthalic diethylene vinyl ether, phthalic diethylene vinyl ether, isophthalic diethylene vinyl ether, phthalic dipropylene vinyl ether, terephthalic dipropylene vinyl ether, isophthalic dipropylene vinyl ether, maleic diethylene vinyl ether, fumaric diethylene vinyl ether, and itaconic diethylene vinyl ether.

Other useful vinyl ether group-containing compounds which can be used herein are vinyl ether group-containing compounds which are synthesized by reacting vinyl ether compounds having active hydrogen as represented by the following formulae (III), (IV), and (V) with compounds having an isocyanate group.

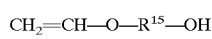 (III)

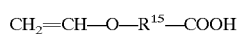 (IV)

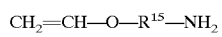 (V)

In the formulae, $R^{15}$ is a normal or branched alkylene group having 1 to 10 carbon atoms. The compounds having an isocyanate group may be those compounds described in "Handbook of Crosslinking Agents," Taiseisha, 1981, for example. Exemplary are polyisocyanates such as triphenylmethane triisocyanate, diphenylmethane diisocyanate, tolylene diisocyanate, 2,4-tolylene diisocyanate dimer, naphthalene-1,5-diisocyanate, o-tolylene diisocyanate, polymethylene polyphenyl isocyanate, and hexamethylene diisocyanate; and polyisocyanate adducts such as an addition product of tolylene diisocyanate and trimethylolpropane, an addition product of hexamethylene diisocyanate and water, and an addition product of xylene diisocyanate and trimethylolpropane. By reacting isocyanate group-containing compounds with active hydrogen-containing vinyl ether compounds, there are obtained various compounds having a vinyl ether group at an end. These compounds are exemplified by the following formulae (VI-1) through (VI-11), though not limited thereto.

 (VI-1)

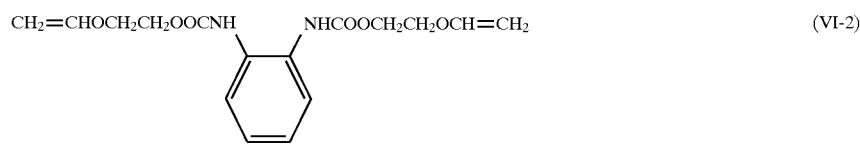 (VI-2)

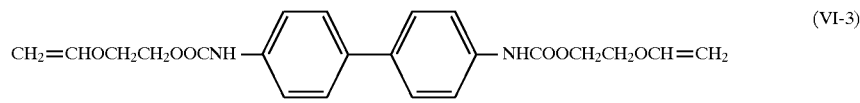 (VI-3)

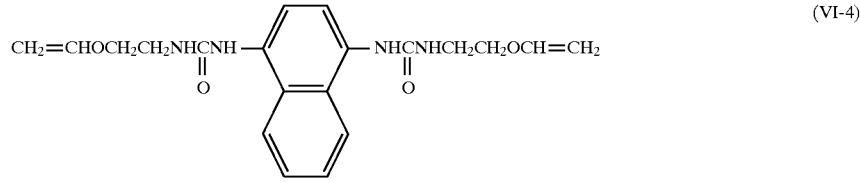 (VI-4)

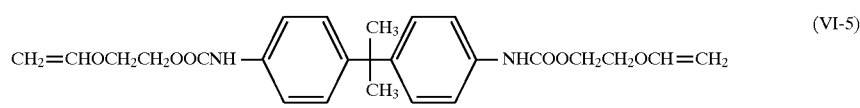 (VI-5)

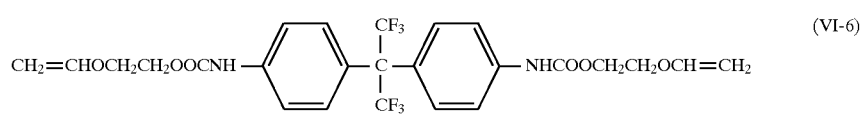 (VI-6)

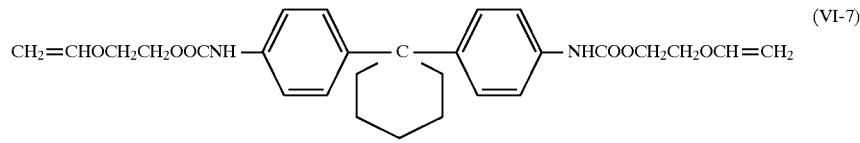 (VI-7)

-continued

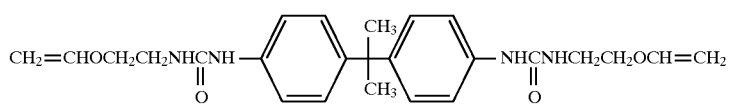

(VI-8)

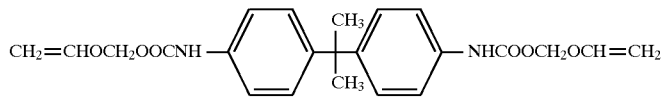

(VI-9)

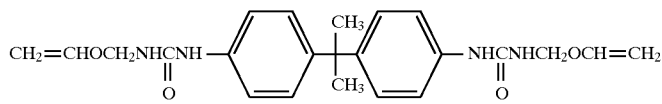

(VI-10)

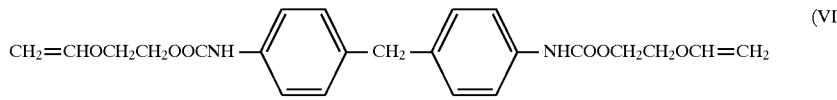

(VI-11)

The vinyl ether group-containing compound (D) is preferably blended in an amount of 0.5 to 24%, especially 1 to 10% by weight of the entire solids in the resist composition. Also it is preferably blended such that the molar ratio of the phenolic hydroxyl group in base resin (B) to the vinyl ether group in vinyl ether group-containing compound (D) may range from 1:0.01 to 1:0.2. If the amount of the vinyl ether group-containing compound blended is too small, there would be formed less crosslinks with base resin (A), failing to improve heat resistance. If the amount of the vinyl ether group-containing compound blended is too large, there would be formed excessive crosslinks, which prevent the acid catalyst from promoting elimination reaction, resulting in low resolution.

According to the invention, the chemically amplified positive resist composition may be a three-component resist system comprising components (A) to (D) mentioned above. If desired, the composition is a system further comprising a dissolution rate regulator. The dissolution rate regulator which can be used herein is a low or high molecular weight compound having at least one acid labile group in a molecule.

More particularly, the chemically amplified positive resist composition may further contain (E) a dissolution rate regulator which is a compound having a molecular weight of 100 to 1,000 and at least two phenolic hydroxyl groups in a molecule, the hydrogen atom of the phenolic hydroxyl group :L being replaced by an acid labile group in an average proportion of 10% to 100% of the entire phenolic hydroxyl groups. Exemplary dissolution rate regulators are bisphenol A derivatives and carbonate derivatives. Especially preferred are bisphenol A derivatives wherein the hydrogen atom of a hydroxyl group is replaced by substituents derived from tert-butyl such as tert-butoxy, tert-butoxycarbonyl, and tert-butoxycarbonylmethyl groups, linear or branched alkoxyalkyl groups such as 1-ethoxyethyl, 1-propoxyethyl, 1-n-butoxyethyl, 1-isobutoxyethyl, 1-tert-butoxyethyl, and 1-tert-amyloxyethyl groups, and cyclic alkoxyalkyl groups such as tetrahydrofuranyl and tetrahydropyranyl groups.

The dissolution rate regulators are preferably blended in amounts of 0 to 40%, more preferably 10 to 30% by weight of the base resin while they may be used alone or in admixture of two or more. Too high an amount of the dissolution rate regulator would detract from the oxygen plasma resistance of a resist film.

Understandably, like the base resin, dissolution rate regulators (E) as mentioned above can be synthesized by chemically reacting a compound having a phenolic hydroxyl group with an acid labile group.

In addition to dissolution rate regulator (E), the chemically amplified positive resist composition of the invention may further contain (F) another dissolution rate regulator which is a compound having a molecular weight of more than 1,000 to 3,000 and a phenolic hydroxyl group in a molecule, the hydrogen atom of the phenolic hydroxyl group being partially replaced by an acid labile group in an average proportion of more than 0% to 60% of the entire phenolic hydroxyl groups. The degree of partial replacement of the hydrogen of phenolic hydroxyl group by an acid labile group is on the average more than 0% to 60%, preferably more than 0% to 40% of the overall phenolic hydroxyl groups. No satisfactory dissolution control is achieved with a degree of substitution of 0% whereas a degree of substitution of more than 60% causes phase separation between polymers, that is, a loss of compatibility. Examples of the acid labile group are as mentioned above.

Examples of the compound as dissolution rate regulator (F) include copolymers of p-butoxystyrene with tert-butyl acrylate and copolymers of p-butoxystyrene with maleic anhydride. They may be used alone or in admixture of two or more. The dissolution rate regulators (E) and (F) are preferably blended in a total amount of 0 to 40%, more preferably 10 to 30% by weight of the base resin.

Understandably, dissolution rate regulators (F) can be synthesized in the same manner as dissolution rate regulators (E).

In the resist composition of the invention, a basic compound (G) is optionally blended. The basic compound is preferably a compound which can suppress the diffusion rate at which the acid generated from the photoacid generator diffuses into a resist coating. The blending of such a basic compound suppresses the diffusion rate of acid in a resist coating to improve resolution, suppresses a change of sensitivity after exposure, and mitigates substrate and environment dependency, achieving improvements in exposure margin and pattern profile. Included in the basic compound are primary, secondary and tertiary aliphatic amines, aromatic amines, heterocyclic amines, alcoholic nitrogenous compounds, and amide derivatives.

Examples of the primary aliphatic amine include methylamine, ethylamine, propylamine, butylamine, pentylamine, and hexylamine. Examples of the secondary aliphatic amine include dimethylamine, diethylamine, dipropylamine, dibutylamine, dipentylamine, and dihexylamine. Examples of the tertiary aliphatic amine include trimethylamine, triethylamine, tripropylamine, tributylamine, tripentylamine, and trihexylamine. Exemplary aromatic and heterocyclic amines are aniline, N-methylaniline, N,N-dimethylaniline, o-toluidine, m-toluidine, p-toluidine, 2,4-lutidine, quinoline, isoquinoline, imidazole, α-picoline, β-picoline, γ-picoline, o-aminobenzoic acid, m-aminobenzoic acid, p-aminobenzoic acid, and 1,2-phenylenediamine. Exemplary alcoholic nitrogenous compounds are ethanolamine, diethanolamine, triethanolamine, propanolamine, dipropanolamine, and tripropanolamine. Examples of the amide compound include formamide, N,N-dimethylformamide, acetamide, N,N-dimethylacetamide, 2-pyrrolidone, and N-methyl-pyrrolidone.

Preferably the basic compound is blended in an amount of 0.1 to 1,000%, especially 1 to 100% by weight based on the weight of the photoacid generator. Less than 0.1% would be ineffective whereas more than 1,000% of the basic compound would adversely affect resolution and sensitivity and even retard the progress of crosslinking reaction, eventually resulting a loss of heat resistance.

The resist composition of the invention may further contain various additives, for example, a surface-active agent for facilitating coating and a light-absorbing agent for reducing irregular reflection from the substrate. The amounts of such optional additives blended are conventional insofar as the objects of the invention are not impaired.

Any well-known lithography may be used to form a resist pattern from a positive resist composition of the invention. For example, the resist composition is spin coated onto a silicon wafer and prebaked to induce crosslinking reaction between the base resin and the vinyl ether group-containing compound. Prebaking conditions should be sufficient for crosslinking reaction to take place and generally include a temperature of 60° to 150° C. and a time of about 1 to 30 minutes. The resulting resist film is generally 0.1 to 2 μm thick. The resist film is then exposed to actinic radiation such as deep-UV, electron beam, and X-ray whereby the photoacid generator is decomposed to generate an acid. The film is further baked at 70° to 150° C. for 60 to 120 seconds (post-exposure baking=PEB) whereby the acid catalyzes to decompose the acid labile group and crosslinks, with the dissolution inhibition being lost. Thereafter the resist film is developed with an aqueous base solution and rinsed with water, yielding a positive resist pattern.

The resist material of the invention is useful as a two-layer resist since it uses a polysiloxane compound of formula (1) as the base resin and is fully resistant to oxygen plasma etching. More particularly, a relatively thick organic polymer layer is formed on a substrate as a lower resist layer before a resist solution formulated according to the invention is spin coated thereon. The upper resist film of the invention is processed as above to form a resist pattern. Thereafter, the resist layers are subject to oxygen plasma etching. The lower resist layer is selectively etched away whereby the pattern of the upper resist layer is formed in the lower resist layer.

For the lower resist layer, a novolak resin based positive resist composition may be used. After it is coated onto a substrate, it is subject to hard baking at 200° C. for one hour, thereby preventing intermixing with the overlying inventive resist composition.

There has been described a chemical amplification positive working resist composition which is sensitive to actinic radiation such as deep-UV, electron beam, and X-ray, has superior sensitivity and resolution, produces heat resistant resist patterns, and lends itself to fine processing technology using electron beam and deep-UV fool radiation. Because of very low absorption at the exposure wavelength of a KrF excimer laser, the resist composition forms a fine pattern having a wall perpendicular to the substrate. Because the resist composition of the invention has high oxygen plasma etching resistance, a two-layer resist having a resist film of the invention coated on a lower resist layer can be finely patterned at a high aspect ratio.

EXAMPLE

Examples of the present invention are given below by way of illustration and not by way of limitation.

Examples 1–17 & Comparative Examples 1–2

Liquid resist compositions were prepared by dissolving a base resin, photoacid generator, vinyl ether group-containing compound, dissolution rate regulator, and basic compound in a solvent in accordance with the formulation shown in Table 1. Each of the compositions was passed through a 0.2-μm Teflon® filter. The resist solutions were examined in Experiments 1 and 2.

The base resins used were five polymers designated Polym. 1 to Polym. 5.

The photoacid generators used were PAG.1 to PAG.4.

The vinyl ether group-containing compounds used were CL.1 to CL.3.

The dissolution rate regulators used were compounds obtained by protecting a compound having a phenolic hydroxyl group with an acid labile group like the base resins. First dissolution rate regulators are designated DRR.1 and DRR.2, and second dissolution rate regulators designated DDR.1' and DRR.2'. The foregoing compounds are illustrated below by chemical formulae.

The basic compound used was triethanolamine.

The solvents used were propylene glycol monomethyl ether acetate (PGMEA) and a mixture of ethyl lactate and butyl acetate (EL/BA).

Experiment 1

Each resist solution was coated onto a silicon substrate and pre-baked on a hot plate at 140° C. for 90 seconds, obtaining a film of 0.35 μm thick. The resist film was exposed to a pattern of light by means of an excimer laser stepper model NSR-2005EX8A (manufactured by Nikon K.K., numerical aperture NA=0.5), developed with an aqueous solution of 2.38% tetramethylammonium hydroxide (TMAH) for one minute, and rinsed with water, yielding a resist pattern.

All resist materials were positive working. Their sensitivity (Eth) was determined using a KrF excimer laser beam (wavelength 248 nm) as deep-UV radiation. Upon imagewise exposure with the KrF excimer laser beam, a 0.22 μm line-and-space pattern could be resolved on the silicon substrate in all the samples and a pattern having a side wall perpendicular to the substrate was formed.

As a heat resistance test, each resist pattern was heated on a hot plate at 150° C. for one minute to observe any change of pattern shape before and after heating. The resist materials within the scope of the invention showed no change of pattern shape before and after heating. The resist material of Comparative Example 1 wherein the vinyl ether group-containing compound was omitted showed a deformed resist pattern after heating, indicating poor heat resistance.

Experiment 2

A silicon wafer was coated with a lower resist film of 2 μm thick using OFPR 800 (Tokyo Oka K.K.), and the film was cured by heating at 200° C. for 5 minutes. As in Experiment 1, the resist solution prepared above was coated onto the lower resist film to a thickness of about 0.35 μm and pre-baked. The resist film was then exposed to a KrF excimer laser beam and developed, forming a pattern on the lower resist film. All the resist solutions could form a pattern on the lower resist film without footing.

Using a parallel plate type sputter etching apparatus, the resist was etched with oxygen gas as an etchant gas. The etching conditions are shown below.

Gas flow rate: 50 SCCM
Gas pressure: 1.3 Pa
RF power: 50 watts
DC bias: 450 volts The lower resist film was etched at a rate of 150 nm/min. while the upper resist film of the inventive composition was etched at a rate of less than 3 nm/min. After 15 minutes of etching, those portions of the lower resist film which were not covered with the upper resist film were completely eliminated, leaving a two-layer resist pattern having a thickness of more than 2 μm.

The results of Experiments 1 and 2 are shown in Table 1.

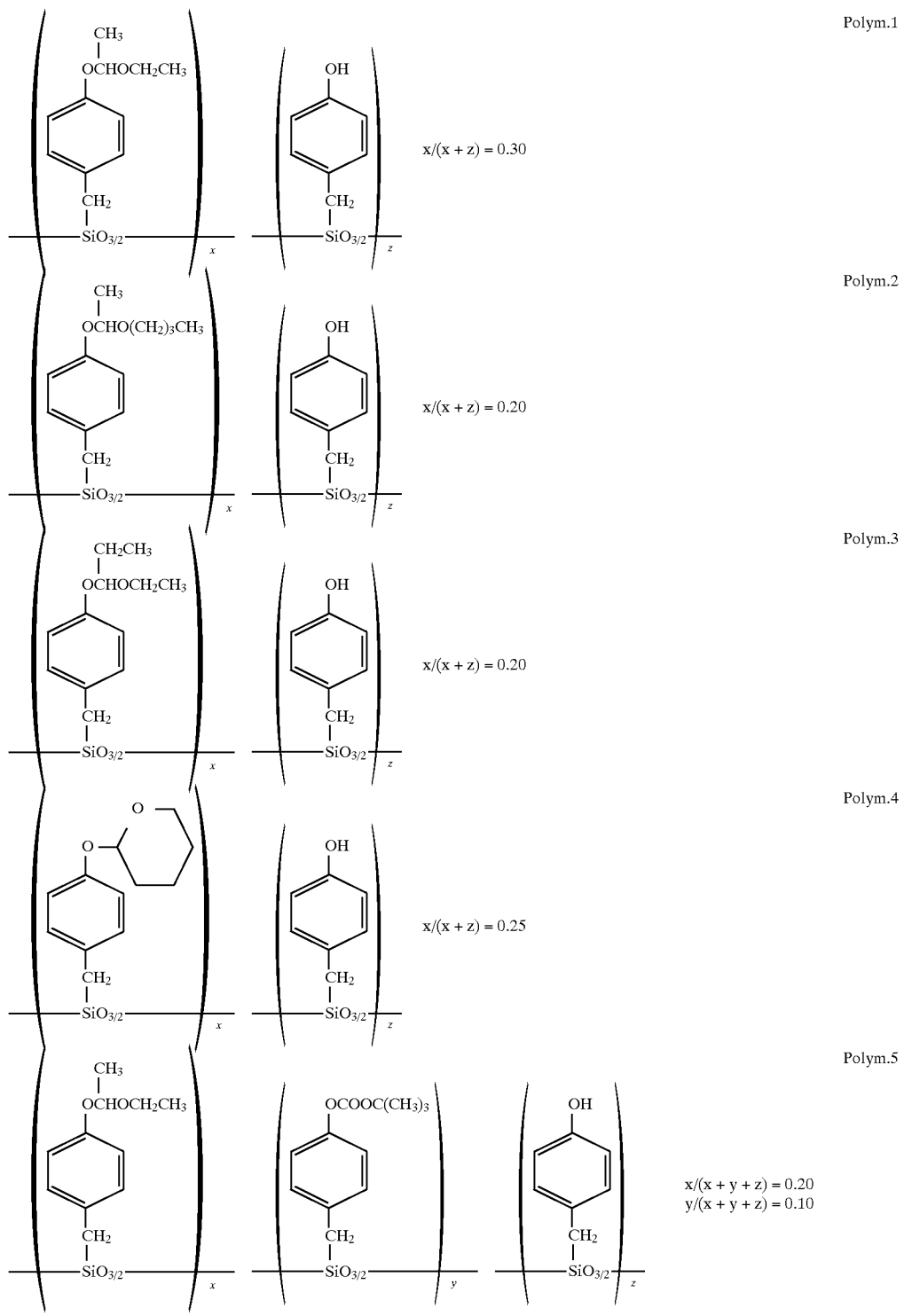

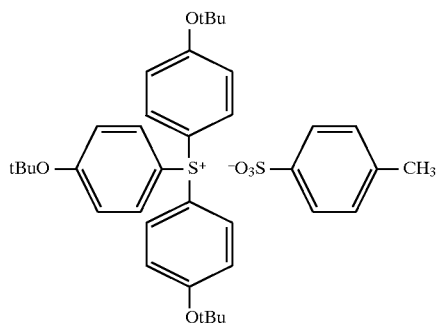
PAG.1
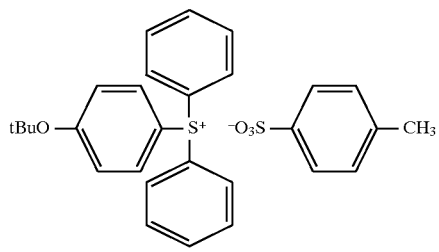
PAG.2
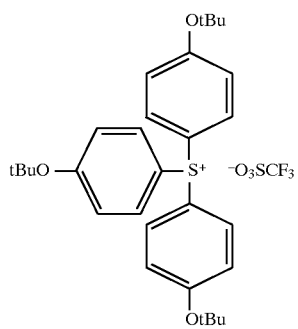
PAG.3
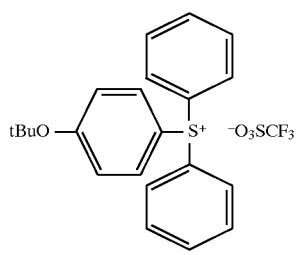
PAG.4
(tBu: tert-butyl)
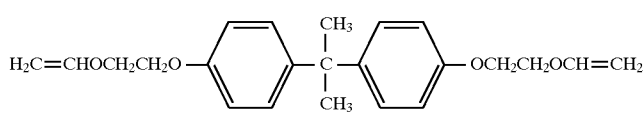
CL.1
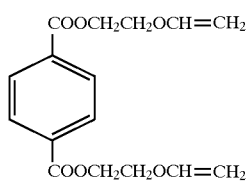
CL.2
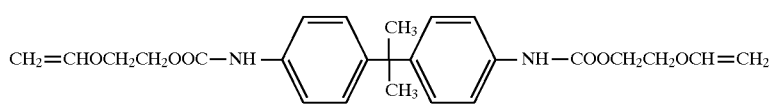
CL.3

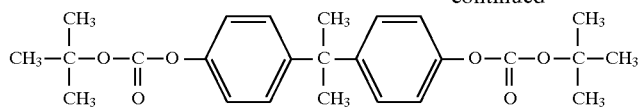
DRR.1

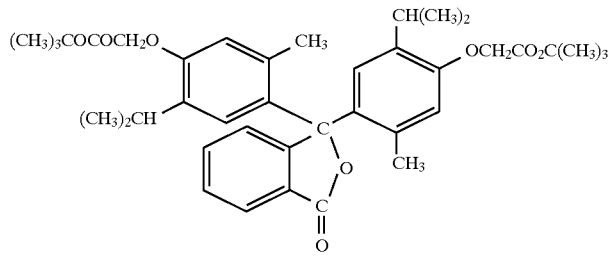
DRR.2

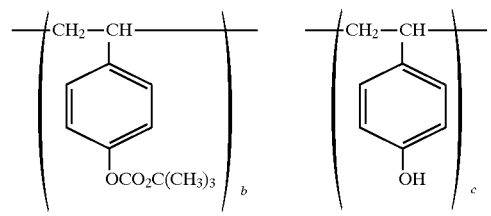

b/(b + c) = 0.2
weight average
molecular weight: 2,500

DRR.1'

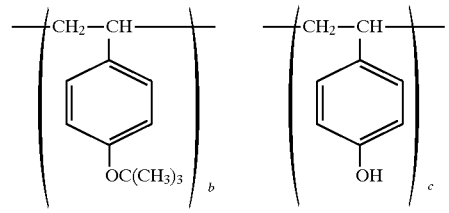

b/(b + c) = 0.02
weight average
molecular weight: 2,500

DRR.2'

TABLE 1

| | Resist composition (pbw in parentheses) | | | | | |
|---|---|---|---|---|---|---|
| | Base resin | Photoacid generator | Vinyl ether compound | Dissolution rate regulator | Basic compound | Solvent | Sensitivity (Eth) |
| Example | | | | | | | |
| 1 | Polym.1 (94) | PAG.1 (4) | CL.1 (2) | — | — | PGMEA (600) | 1.2 |
| 2 | Polym.1 (80) | PAG.2 (2) | CL.1 (2) | DRR.1 (16) | — | PGMEA (600) | 2.4 |
| 3 | Polym.1 (92) | PAG.2 (4) | CL.1 (4) | — | TEA (0.05) | PGMEA (600) | 5.0 |
| 4 | Polym.1 (94) | PAG.1 (4) | CL.2 (2) | — | — | EL/BA (500/100) | 1.3 |
| 5 | Polym.1 (94) | PAG.1 (4) | CL.3 (2) | — | — | EL/BA (500/100) | 1.4 |
| 6 | Polym.1 (80) | PAG.2 (2) | CL.1 (2) | DRR.2 (16) | — | EL/BA (500/100) | 2.5 |
| 7 | Polym.1 (88) | PAG.2 (2) | CL.1 (2) | DRR.2' (8) | — | EL/BA (500/100) | 2.6 |
| 8 | Polym.1 (80) | PAG.2 (2) | CL.1 (2) | DRR.2(8) DRR.2'(8) | — | EL/BA (500/100) | 2.5 |
| 9 | Polym.2 (94) | PAG.1 (4) | CL.1 (2) | — | — | PGMEA (600) | 0.8 |
| 10 | Polym.2 (80) | PAG.2 (2) | CL.1 (2) | DRR.1 (16) | — | PGMEA (600) | 1.6 |
| 11 | Polym.3 (94) | PAG.1 (4) | CL.1 (2) | — | — | PGMEA (600) | 1.2 |

TABLE 1-continued

| | Resist composition (pbw in parentheses) | | | | | | |
|---|---|---|---|---|---|---|---|
| | Base resin | Photoacid generator | Vinyl ether compound | Dissolution rate regulator | Basic compound | Solvent | Sensitivity (Eth) |
| 12 | Polym.3 (80) | PAG.2 (2) | CL.1 (2) | DRR.1 (16) | — | PGMEA (600) | 2.5 |
| 13 | Polym.4 (94) | PAG.3 (4) | CL.1 (2) | — | — | PGMEA (600) | 1.5 |
| 14 | Polym.4 (80) | PAG.4 (2) | CL.1 (2) | DRR.1 (16) | — | PGMEA (600) | 3.0 |
| 15 | Polym.5 (94) | PAG.1 (4) | CL.1 (2) | — | — | PGMEA (600) | 1.5 |
| 16 | Polym.5 (80) | PAG.2 (2) | CL.1 (2) | DRR.1 (16) | — | PGMEA (600) | 3.1 |
| 17 | Polym.5 (92) | PAG.3 (4) | CL.1 (4) | — | TEA (0.05) | PGMEA (600) | 4.5 |
| Comparative Example | | | | | | | |
| 1 | Polym.1 (94) | PAG.1 (4) | — | — | — | PGMEA (600) | 1.5 |
| 2 | Polym.5 (92) | PA.3 (4) | CL.1 (4) | — | TEA (0.05) | PGMEA (600) | 5.0 |

It is evident from Table 1 that chemically amplified positive resist compositions within the scope of the invention have high sensitivity and resolution and can form a heat resistant pattern having a side wall perpendicular to the underlying substrate. The compositions are advantageous as a resist material for the two-layer resist technique. When the vinyl ether group-containing compound is not blended, the resulting resist pattern is less resistant to heat.

Japanese Patent Application No. 104589/1996 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A chemically amplified positive resist composition comprising (A) an organic solvent, (B) a base resin in the form of a polymer of the following general formula (1) having a weight average molecular weight of 2,000 to 50,000,

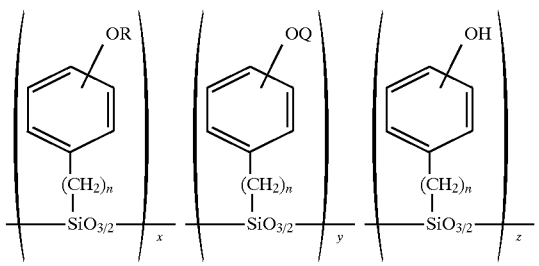

wherein R is a group represented by the following general formula (2):

wherein $R^1$ and $R^2$ are independently a hydrogen atom or a normal or branched alkyl group having 1 to 6 carbon atoms, $R^3$ is a normal, branched or cyclic alkyl group having 1 to 10 carbon atoms, or $R^2$ and $R^3$, taken together, may form a ring, Q is an acid labile group different from R, letters x, y and z are numbers satisfying $0.05 \leq x/(x+y+z) \leq 0.8$, $0 \leq y/(x+y+z) \leq 0.5$, and $0.2 \leq z/(x+y+z) \leq 0.95$, $x+y+z=1$, and n is an integer of 1 to 3, (C) a photoacid generator, and (D) a compound having at least two vinyl ether groups in a molecule.

2. A chemically amplified positive resist composition of claim 1, further comprising:

(E) a dissolution rate regulator in the form of a compound having a molecular weight of 100 to 1,000 and at least two phenolic hydroxyl groups in a molecule, the hydrogen atom of the phenolic hydroxyl group being replaced by an acid labile group in an average proportion of 10 to 100% of the entire phenolic hydroxyl groups.

3. The chemically amplified positive resist composition of claim 2 further comprising (G) an additive in the form of a basic compound.

4. The chemically amplified positive resist composition of claim 2 wherein said photoacid generator (C) is an onium salt.

5. The composition of claim 2, wherein the dissolution rate regulator (E) is provided in an amount of up to 40% by weight of the base resin.

6. A chemically amplified positive resist composition of claim 1, further comprising:

(E) a dissolution rate regulator in the form of a compound having a molecular weight of 100 to 1,000 and at least two phenolic hydroxyl groups in a molecule, the hydrogen atom of the phenolic hydroxyl group being replaced by an acid labile group in an average proportion of 10 to 100% of the entire phenolic hydroxyl groups, and (F) another dissolution rate regulator in the form of a compound having a molecular weight of more than 1,000 to 3,000 and a phenolic hydroxyl group in a molecule, the hydrogen atom of the phenolic group being partially replaced by an acid labile group in an average proportion of from more than 0% up to 60% of the entire phenolic hydroxyl groups.

7. The chemically amplified positive resist composition of claim 6 further comprising (G) an additive in the form of a basic compound.

8. The chemically amplified positive resist composition of claim 6 wherein said photoacid generator (C) is an onium salt.

9. The composition of claim 6, wherein the total amount of dissolution rate regulators (E) and (F) is provided in an amount of up to 40% by weight of the base resin.

10. The chemically amplified positive resist composition of claim 1 further comprising (G) an additive in the form of a basic compound.

11. The chemically amplified positive resist composition of claim 1 wherein said photoacid generator (C) is an onium salt.

12. The composition of claim 1, wherein the amount of organic solvent (A) based on the weight of the base resin is about 200 to 1000% by weight, the amount of photoacid generator (C) is 0.5 to 15% by weight based on the weight of solids in the composition, and the amount of compound having at least two vinyl ether groups in a molecule (D) is 0.5 to 24% by weight of the solids in the composition.

13. The composition of claim 1, wherein the amount of compound having at least two vinyl ether groups in a molecule (D) is such that the molar ratio of phenolic hydroxyl groups in base resin (B) to vinyl ether groups in (D) is from 1:0.01 to 1:0.2.

14. The composition of claim 1, wherein Q in formula I is an alkoxyalkyl group of formula (2) different from R, a carbonyl group of the formula (4)

wherein $R^4$ is a normal or branched alkyl group having 1 to 6 carbon atoms and a is equal to 0 or 1, a trialkylsilyl group whose alkyl moieties have 1 to 6 carbon atoms, a tetrahydropyranyl, a tetrahydrofuranyl or a tert-butyl group.

15. The composition of claim 1, wherein the base resin (B) has a weight average molecular weight of 3,000 to 20,000.

16. The composition of claim 1, wherein the photoacid generator (C) is an onium salt of the formula (5):

wherein $R^5$ is independently selected from substituted or unsubstituted aromatic groups, M is sulfonium or iodonium, Y is a substituted or unsubstituted alkyl or sulfonate group and b is equal to 2 or 3.

17. The composition of claim 1, wherein the compound having at least two vinyl ether groups in a molecule (D) is a vinyl ether compound of the formula (I) or (II):

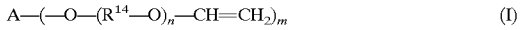

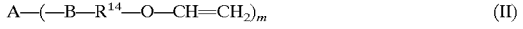

wherein A is an alkyl, aryl or heterocyclic group having a valence of m, B is —CO—O—, —NHCOO— or —NHCONH—, $R^{14}$ is a normal or branched alkylene group having 1 to 10 carbon atoms, letter n is 0 or an integer of 1 to 10, m is an integer of 2 to 6.

* * * * *